United States Patent
Ihama (10) Patent No.: US 8,298,855 B2
(45) Date of Patent: Oct. 30, 2012

(54) PHOTOELECTRIC CONVERSION DEVICE, IMAGING DEVICE, AND PROCESS FOR PRODUCING THE PHOTOELECTRIC CONVERSION DEVICE

(75) Inventor: Mikio Ihama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/985,078

(22) Filed: Jan. 5, 2011

(65) Prior Publication Data

US 2011/0097839 A1 Apr. 28, 2011

Related U.S. Application Data

(62) Division of application No. 11/508,174, filed on Aug. 23, 2006, now Pat. No. 7,888,759.

(30) Foreign Application Priority Data

Aug. 23, 2005 (JP) ................................ 2005-240965

(51) Int. Cl.
*H01L 21/00* (2006.01)
(52) U.S. Cl. .................. 438/82; 438/944; 257/E21.617
(58) Field of Classification Search .................. 438/75, 438/82, 944; 257/E21.456, E21.457, E21.617
See application file for complete search history.

(56) References Cited

U.S. PATENT DOCUMENTS

| | | | |
|---|---|---|---|
| 5,164,322 A | 11/1992 | Yamazaki et al. | |
| 5,677,201 A | 10/1997 | Kozuka et al. | |
| 5,965,875 A | 10/1999 | Merrill | |
| 7,046,282 B1 | 5/2006 | Zhang et al. | |
| 2003/0173532 A1 | 9/2003 | Takahashi et al. | |
| 2003/0209651 A1 | 11/2003 | Iwasaki | |
| 2004/0235227 A1* | 11/2004 | Kawase | 438/158 |
| 2005/0205903 A1 | 9/2005 | Hioki | |
| 2005/0227399 A1 | 10/2005 | Hayase et al. | |

FOREIGN PATENT DOCUMENTS

| | | |
|---|---|---|
| JP | 1 282875 A | 11/1989 |
| JP | 11-97690 A | 4/1999 |
| JP | 2002-502129 A | 1/2002 |
| JP | 2002 513145 A | 5/2002 |
| JP | 2003 234460 A | 8/2003 |
| JP | 2003 332551 A | 11/2003 |
| WO | WO 99/39395 A1 | 8/1999 |

OTHER PUBLICATIONS

Office Action dated Sep. 20, 2011 from the Japanese Patent Office in counterpart Japanese application No. 2005-240965.

* cited by examiner

*Primary Examiner* — Chandra Chaudhari
(74) *Attorney, Agent, or Firm* — Sughrue Mion, PLLC (57) ABSTRACT

A photoelectric conversion device comprising: a semiconductor substrate; an inorganic photoelectric conversion layer provided within the semiconductor substrate; and an organic photoelectric conversion layer provided above the inorganic photoelectric conversion layer, wherein the organic photoelectric conversion layer is prepared by a shadow mask method.

1 Claim, 1 Drawing Sheet

PHOTOELECTRIC CONVERSION DEVICE, IMAGING DEVICE, AND PROCESS FOR PRODUCING THE PHOTOELECTRIC CONVERSION DEVICE

This is a Divisional of application Ser. No. 11/508,174 filed on Aug. 23, 2006, which claims priority from application No. 2005-240965, filed Aug. 23, 2005 in Japan. These applications are hereby incorporated herein by reference in their entirety.

FIELD OF THE INVENTION

The present invention relates to a photoelectric conversion device and a solid imaging device each including a multilayered photoelectric conversion site which is configured to have an organic photoelectric conversion layer and an inorganic photoelectric conversion layer and to a process for producing the same.

BACKGROUND OF THE INVENTION

An imaging system using a silver salt photosensitive material represented by color negative photosensitive materials and color reversal photosensitive materials and a camera is being replaced by a digital camera using a solid imaging system such as CCD and CMOS because of its convenience. However, according to a method using a three-color mosaic color filter for a single board sensor which is utilized in the existing solid imaging system, since one pixel of a photosensor is corresponding to any one of blue, green and red lights, there is an issue that it is inferior to the imaging system using a silver salt photosensitive material and a camera with respect to the image quality for reasons such that a high dissolution cannot be taken; and that from the standpoint of a pixel unit, incident lights having wavelengths other than a desired color are adsorbed by the color filter so that they are not effectively utilized. Also, since blue, green and red colors are detected in different positions, color separation occurs so that a false color may possibly be generated. Thus, an optical low-pass filter is necessary, resulting in the occurrence of a loss of light.

In order to solving these problems, there are disclosed solid imaging devices of a stack type similar to silver salt photosensitive materials (see, for example, JP-T-2002-513145, JP-A-2003-234460, JP-A-1-282875 and JP-A-2003-332551).

SUMMARY OF THE INVENTION

In particular, it is thought that a photoelectric conversion device which is made of an inorganic photoelectric conversion layer having an organic photoelectric conversion layer stacked thereon is provided with advantages of both an inorganic material and an organic material and involves a high possibility that it is superior to a silver salt photosensitive material with respect to the image quality.

However, a process of producing such a photoelectric conversion device or image device has not been clarified yet. In particular, if it is intended to produce an organic photoelectric conversion layer by a current production process of an inorganic photoelectric conversion layer, a series of photolithography and etching steps are required, and a problem which has not been considered problematic in the production of an inorganic photoelectric conversion layer becomes actual. In particular, the damage to an organic photoelectric conversion layer is of a problem.

A problem of the invention is to provide a process for producing a photoelectric conversion device or image device containing an organic photoelectric conversion layer without causing damage to the photoelectric conversion layer.

The present inventor has found that in a photoelectric conversion device which is made of an inorganic photoelectric conversion layer having an organic photoelectric conversion layer stacked thereon, by carrying out connection of a counter electrode provided on the organic photoelectric conversion layer to a signal circuit or the like via a connection electrode, photolithography, etching and so on become unnecessary and that the production process of an organic photoelectric conversion layer can be achieved by a shadow mask method. That is, the foregoing problem has been attained by the following (1) to (13).

(1) A photoelectric conversion device including an inorganic photoelectric conversion layer within a semiconductor substrate and an organic photoelectric conversion layer stacked above the inorganic photoelectric conversion layer, wherein the organic photoelectric conversion layer is prepared by a shadow mask method.

(2) The photoelectric conversion device as set forth in (1), wherein the organic photoelectric conversion layer has at least one counter electrode and plural pixel electrodes adjacent thereto, and the counter electrode is connected to a connection electrode provided above the semiconductor substrate, the connection electrode being for connecting the counter electrode to the semiconductor substrate.

(3) The photoelectric conversion device as set forth in (2), wherein a distance between the connection electrode and the pixel electrode located in the closest position thereto is 10 μm or more and not more than 3 mm.

(4) A photoelectric conversion device including an inorganic photoelectric conversion layer within a semiconductor substrate and an organic photoelectric conversion layer stacked above the inorganic photoelectric conversion layer, wherein the organic photoelectric conversion layer has at least one counter electrode and plural pixel electrodes adjacent thereto; the counter electrode is connected to a connection electrode provided above the semiconductor substrate, the connection electrode being for connecting the counter electrode to the semiconductor substrate; and a distance between the connection electrode and the pixel electrode located in the closest position thereto is 10 μm or more and not more than 3 mm.

(5) The photoelectric conversion device as set forth in any one of (1) to (4), wherein the connection electrode is present within an insulating layer provided on the semiconductor substrate.

(6) The photoelectric conversion device as set forth in any one of (1) to (5), wherein the connection electrode is connected to a peripheral pad.

(7) The photoelectric conversion device as set forth in any one of (1) to (6), wherein the semiconductor is made of a silicon semiconductor; the inorganic photoelectric conversion layer differentiates at least blue light and red light into a depth direction of a silicon semiconductor and photoelectrically converting them; and the organic photoelectric conversion layer photoelectrically converting at least green light.

(8) The photoelectric conversion device as set forth in any one of (1) to (7), wherein the pixel electrodes, the counter electrode and the connection electrode of the organic photoelectric conversion layer are each made of a transparent conducting layer.

(9) An imaging device including the photoelectric conversion device as set forth in any one of (1) to (8).

(10) A process for producing a photoelectric conversion device including an inorganic photoelectric conversion layer within a semiconductor substrate and an organic photoelectric conversion layer stacked above the inorganic photoelectric conversion layer, wherein a production process of the organic photoelectric conversion layer is carried out by a shadow mask method.

(11) The process for producing a photoelectric conversion device as set forth in (10), wherein plural pixel electrodes and a connection electrode are provided above the semiconductor substrate; and the organic photoelectric conversion layer is provided by a shadow mask method such that it comes into contact with the plural pixel electrodes.

(12) The process for producing a photoelectric conversion device as set forth in (11), wherein at least one counter electrode is provided by a shadow mask method such that it comes into contact with the organic photoelectric conversion layer and is connected to the connection electrode.

(13) The process for producing a photoelectric conversion device as set forth in (11) or (12), wherein a distance between the connection electrode and the pixel electrode located in the closest position thereto is 10 μm or more and not more than 3 mm.

In the photoelectric conversion device of the invention, the production is carried out by a shadow mask method since the preparation of an organic photoelectric conversion layer. Accordingly, various damages to the organic layer are reduced so that it becomes possible to stably produce a photoelectric conversion device or an imaging device of an inorganic/organic stack type having fine pixels. For example, by newly providing a connection electrode, it has become possible to stack an organic photoelectric conversion layer and so on by a shadow mask method thereafter.

DETAILED DESCRIPTION OF THE INVENTION

The photoelectric conversion device of the invention will be hereunder described with reference to the drawings.

Figure 1:
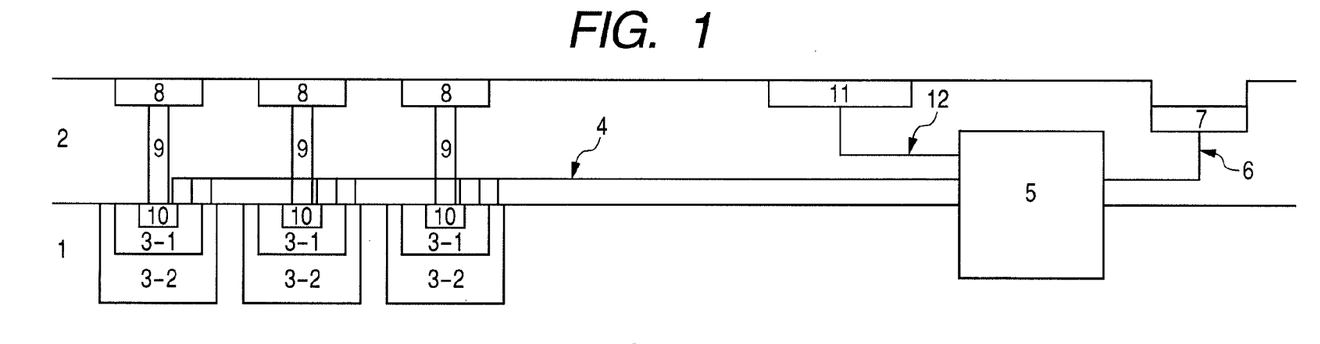
FIG. 1 is a cross-sectional view to explain a preferred embodiment of an inorganic photoelectric conversion layer before stacking an organic photoelectric conversion layer thereon.

FIG. 1 shows a cross section of a preferred embodiment of an inorganic photoelectric conversion layer before stacking an organic photoelectric conversion layer thereon. 1 stands for a silicon substrate; and 2 stands for an insulating layer. 3-1 stands for a potential well which photoelectrically converts mainly blue light and stores an electric charge therein and can be formed of an appropriate stack of a p-type and an n-type. 3-2 stands for a potential well which photoelectrically converts mainly red light and stores an electric charge therein. Accordingly, FIG. 1 shows a part of three pixels. Signals of blue light and red light of each pixel are wired by 4 through a switching and a transistor of an amplifier or the like and connected to 5 (4 is shown by a single line for convenience). The switching and the transistor of an amplifier or the like are omitted in FIG. 1. 5 schematically shows a horizontal or vertical shift register circuit, a CDS circuit, a clock circuit, or the like. The photoelectrically converted signal of each pixel is connected to a peripheral pad 7 through a wiring 6. Usual packaging is carried out by wire bonding from this peripheral pad. In the invention, since the organic photoelectric conversion layer is stacked on the inorganic photoelectric conversion layer, a pixel electrode 8 for the organic photoelectric conversion layer is provided within or on the insulating layer. The pixel electrode is preferably a transparent electrode and makes it possible to achieve light absorption on the inorganic photoelectric conversion layer. A signal on the pixel electrode 8 is stored in a potential well 10 through a via 9. The signal on the organic photoelectric conversion layer is preferably a signal mainly against green light. Likewise the signals of blue light and red light, the signal of green light of each pixel is wired by 4 through a switching and a transistor of an amplifier or the like, connected to 5 and finally communicated with the peripheral pad 7 through the wiring 6. A characteristic feature of the invention resides in the matter that a connection electrode 11 for connecting the counter electrode to the semiconductor substrate is provided on the inorganic photoelectric conversion layer. The connection electrode 11 is finally connected to the peripheral pad 7 through a wiring 12. By preparing the present connection electrode 11 by employing appropriate arrangement and material, the production process of an organic photoelectric conversion layer can be carried out by a shadow mask method.

The connection electrode 11 will be hereunder described with reference to FIG. 2 including the production process of an organic photoelectric conversion layer by a shadow mask method.

The connection electrode 11 takes electric connection to a counter electrode 22, and its material is basically arbitrary so far as it is conducting. Examples thereof include metals such as copper, aluminum, silver, gold, chromium, and tungsten, alloys, and metal oxides. The connection electrode 11 is preferably a transparent conducting layer which can be prepared commonly to the pixel electrode 8 from the process viewpoint. Specific examples thereof include ITO and IZO. The size and shape of the connection electrode 11 are basically arbitrary because it is only required to take electric connection. In the case of a square, it is preferable that the length of one side is 1 μm or more. However, when the length is too large, an area is taken on the silicon substrate, and therefore, the length is preferably not more than 1 mm. In order to ensure the electric connection to the counter electrode 22, it is also preferable that the shape of the connection electrode 11 is a rectangle. At that time, a short side/long side ratio is preferably in the range of from 1 to 1,000. It is also possible to provide the connection electrode 11 in two or more places for the same reason. With respect to the arrangement, the connection electrode 11 is basically provided in a position surrounding the pixel electrode 8. It is preferable for the photoelectric conversion device that the area occupied by the pixel electrode is increased even a little, thereby making a peripheral circuit small. Thus, the connection electrode 11 can also be provided right above a circuit such as the horizontal or vertical shift register 5.

The connection electrode 11 is produced on the surface of the insulating layer 2 in producing the inorganic photoelectric conversion layer before stacking the organic photoelectric conversion layer as illustrated in FIG. 1 (the inorganic photoelectric conversion layer can be produced by a method such as photolithography and etching as represented by a current CMOS process). Thereafter, an organic photoelectric conversion layer 21 is stacked by a shadow mask method such that it does not come into contact with the connection electrode 11. In order to enhance the photoelectric conversion efficiency, the organic photoelectric conversion layer preferably takes a multi-layered configuration as described later. The counter electrode 22 is stacked on the organic photoelectric conversion layer 21 by a shadow mask method. In order that the organic photoelectric conversion layer 21 may be stacked without causing direct contact with the connection electrode 11 by a shadow mask method, a distance between the connection electrode 11 and the pixel electrode 8 located in the closest position thereto is preferably 10 μm or more, more preferably μm or more, further preferably 100 μm or more, and especially preferably 300 μm or more. When the distance is too long, an unnecessary part of the device size (chip size) increases, and therefore, the distance is preferably not more than 3 mm, and more preferably not more than 1 mm. The counter electrode 22 is preferably a transparent electrode and is electrically connected to the connection electrode 11. For the purposes of bringing commonness in the process with the pixel electrode 8 and avoiding connection failure due to the formation of an oxide layer, it is preferable that the connection electrode is a transparent conducting layer. A protective layer 23 is stacked on the counter electrode 22 by a shadow mask method. In order that the protective layer 23 may be stacked without causing direct contact with the peripheral pad 7 by a shadow mask method, a distance between the connection electrode 11 and the peripheral pad 7 is preferably 200 μm or more, and more preferably 500 μm or more. When the distance is too long, an unnecessary part of the chip size increases, and therefore, the distance is preferably not more than 5 mm, and more preferably not more than 3 mm.

As described previously, by providing the connection electrode, an organic photoelectric conversion layer can be stacked by a shadow mask method, and a photoelectric conversion device or an imaging device which is made of an inorganic photoelectric conversion layer having an organic photoelectric conversion layer stacked thereon can be produced. In the invention, the inorganic photoelectric conversion layer as illustrated in FIG. 1 can be produced by a method such as photolithography and etching as represented by a current CMOS process. The production can be carried out by a shadow mask method since the preparation of the organic photoelectric conversion layer as illustrated in FIG. 2. Accordingly, various damages to the organic layer are reduced so that it becomes possible to stably produce a photoelectric conversion device or imaging device having fine pixels.

The photoelectric conversion device of the invention will be hereunder described.

The photoelectric conversion device is made of an electromagnetic wave absorption/photoelectric conversion site and a charge storage of charge as generated by photoelectric conversion/transfer/and read-out site.

For example, the electromagnetic wave absorption/photoelectric conversion site has a stack type structure made of at least two layers, which is capable of absorbing each of blue light, green light and red light and undergoing photoelectric conversion. A blue light absorbing layer (B) is able to absorb at least light of 400 nm or more and not more than 500 nm and preferably has an absorptance of a peak wavelength in that wavelength region of 50% or more. A green light absorbing layer (G) is able to absorb at least light of 500 nm or more and not more than 600 nm and preferably has an absorptance of a peak wavelength in that wavelength region of 50% or more. A red light absorbing layer (R) is able to absorb at least light of 600 nm or more and not more than 700 nm and preferably has an absorptance of a peak wavelength in that wavelength region of 50% or more. The order of these layers is not limited. In the case of a three-layer stack type structure, orders of BGR, BRG, GBR, GRB, RBG and RGB from the upper layer (light incident side) are possible. It is preferable that the uppermost layer is G. In the case of a two-layer stack type structure, when the upper layer is an R layer, a BG layer is formed as the lower layer in the same planar state; when the upper layer is a B layer, a GR layer is formed as the lower layer in the same planar state; and when the upper layer is a G layer, a BR layer is formed as the lower layer in the same planar state. It is preferable that the upper layer is a G layer and the lower layer is a BR layer in the same planar state. In the case where two light absorbing layers are provided in the same planar state of the lower layer in this way, it is preferable that a filter layer capable of undergoing color separation is provided in, for example, a mosaic state on the upper layer or between the upper layer and the lower layer. Under some circumstances, it is possible to provide a fourth or polynomial layer as a new layer or in the same planar state.

The charge storage/transfer/read-out site is provided under the electromagnetic wave absorption/photoelectric conversion site. It is preferable that the electromagnetic wave absorption/photoelectric conversion site which is the lower layer also serves as the charge storage/transfer/read-out site.

In the photoelectric conversion device of the invention, the electromagnetic wave absorption/photoelectric conversion site is made of an inorganic layer having an organic layer stacked thereon. In this case, basically, when the organic layer is made of a single layer, the inorganic layer is made of a single layer or two layers; and when the organic layer is made of two layers, the inorganic layer is made of a single layer. When each of the organic layer and the inorganic layer is made of a single layer, the inorganic layer forms an electromagnetic wave absorption/photoelectric conversion site of two or more colors in the same planar state. It is preferable that the upper layer is made of an organic layer which is constructed of a G layer and the lower layer is made of an inorganic layer which is constructed of a B layer and an R layer in this order from the upper side. Under some circumstances, it is possible to provide a fourth or polynomial layer as a new layer or in the same planar state. When the organic layer forms a B/G/R layer, a charge storage/transfer/read-out site is provided thereunder. When an inorganic layer is used as the electromagnetic wave absorption/photoelectric conversion site, this inorganic layer also serves as the charge storage/transfer/read-out site.

The organic photoelectric conversion layer preferably has a maximum absorption wavelength in the range of from 510 to 560 nm, and more preferably in the range of from 520 to 550 nm. The "maximum absorption wavelength" as referred to herein means an absorption wavelength having the highest absorption factor. This absorption factor at the maximum absorption wavelength, namely the maximum absorption factor is preferably 80% or more and not more than 100%, and more preferably 90% or more and not more than 100%. A half-value width of absorption factor is preferably 50 nm or more and not more than 100 nm, and more preferably 60 nm or more and not more than 90 nm. The "half-value width of absorption factor" as referred to herein means a width of the absorption wavelength at an absorption factor of a half value of the maximum absorption factor.

The organic photoelectric conversion layer of the invention will be hereunder described. An electromagnetic wave absorption/photoelectric conversion site made of an organic layer which is the organic photoelectric conversion layer of the invention is made of an organic layer which is interposed between one pair of electrodes. The organic layer is formed by superposing or mixing a site for absorbing electromagnetic waves, a photoelectric conversion site, an electron transport site, a hole transport site, an electron blocking site, a hole blocking site, a crystallization preventing site, an electrode, an interlaminar contact improving site, and so on. It is preferable that the organic layer contains an organic p-type compound or an organic n-type compound.

The organic p-type semiconductor (compound) is an organic semiconductor (compound) having donor properties and refers to an organic compound which is mainly represented by a hole transport organic compound and which has properties such that it is liable to provide an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transport organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene derieveatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, Spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

Next, the metal complex compound will be described. The metal complex compound is a metal complex having a ligand containing at least one of a nitrogen atom, an oxygen atom and a sulfur atom as coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), an aromatic heterocyclic oxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, an aromatic heterocyclic oxy ligand, or a siloxy ligand; and further preferably a nitrogen-containing heterocyclic ligand, an aryloxy ligand, or a siloxy ligand.

In the invention, the case containing a photoelectric conversion layer (photosensitive layer) having a p-type semiconductor layer and an n-type semiconductor layer between one pair of electrodes, with at least one of the p-type semiconductor layer and the n-type semiconductor layer being an organic semiconductor, and a bulk heterojunction structure layer containing the p-type semiconductor and the n-type semiconductor as an interlayer between these semiconductor layers is preferable. In such case, in the photoelectric conversion layer, by containing a bulk heterojunction structure in the organic layer, a drawback that the organic layer has a short carrier diffusion length is compensated, thereby improving the photoelectric conversion efficiency. Incidentally, the bulk heterojunction structure is described in detail in Japanese Patent Application No. 2004-080639.

In the invention, the case where a photoelectric conversion layer (photosensitive layer) having a structure having the number of a repeating structure (tandem structure) of a pn junction layer formed of the p-type semiconductor layer and the n-type semiconductor layer is contained between one pair of electrodes of 2 or more is preferable; and the case where a thin layer made of a conducting material is inserted between the foregoing repeating structures is more preferable. The number of the repeating structure (tandem structure) of a pn junction layer is not limited. For the purpose of enhancing the photoelectric conversion efficiency, the number of the repeating structure (tandem structure) of a pn junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930.

In the photoelectric conversion layer having a layer of a p-type semiconductor and a layer of an n-type semiconductor (preferably a mixed or dispersed (bulk heterojunction structure) layer) between one pair of electrodes, the case of a photoelectric conversion layer which is characterized by containing an orientation-controlled organic compound in at least one of the p-type semiconductor and the n-type semiconductor is preferable; and the case of a photoelectric conversion layer which is characterized by containing an orientation-controlled (orientation controllable) organic compound in both the p-type semiconductor and the n-type semiconductor is more preferable. As the organic compound which is used in the organic layer of the photoelectric conversion device, an organic compound having a π-conjugated electron is preferably used. The π-electron plane is not vertical to a substrate (electrode substrate) and is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is only required that even a part of the layer of the orientation-controlled organic compound is contained over the whole of the organic layer. A proportion of the orientation-controlled portion to the whole of the organic layer is preferably 10% or more, more preferably 30% or more, further preferably 50% or more, still further preferably 70% or more, especially preferably 90% or more, and most preferably 100%. In the photoelectric conversion layer, by controlling the orientation of the organic compound of the organic layer, the foregoing state compensates a drawback that the organic layer in the photoelectric conversion layer has a short carrier diffusion length, thereby improving the photoelectric conversion efficiency.

In the case where the orientation of an organic compound is controlled, it is more preferable that the heterojunction plane (for example, a pn junction plane) is not in parallel to a substrate. In this case, it is preferable that the heterojunction plane is not in parallel to the substrate (electrode substrate) but is oriented at an angle close to verticality to the substrate as far as position. The angle to the substrate is preferable 0° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate). As described previously, it is only required that even a part of the layer of the heterojunction plane-controlled organic compound is contained over the whole of the organic layer. A proportion of the orientation-controlled portion to the whole of the organic layer is preferably 10% or more, more preferably 30% or more, further preferably 50% or more, still further preferably 70% or more, especially preferably 90% or more, and most preferably 100%. In such case, the area of the heterojunction plane in the organic layer increases and the amount of a carrier such as an electron as formed on the interface, a hole, and a pair of an electron and a hole increases so that it is possible to improve the photoelectric conversion efficiency. In the light of the above, in the photoelectric conversion layer in which the orientation of the organic compound on both the heterojunction plane and the π-electron plane is controlled, it is possible to improve especially the photoelectric conversion efficiency. These states are described in detail in Japanese Patent Application No. 2004-079931.

From the standpoint of optical absorption, it is preferable that the layer thickness of the organic dye layer is as thick as possible. However, taking into consideration a proportion which does not contribute to the charge separation, the layer thickness of the organic dye layer in the invention is preferably 30 nm or more and not more than 300 nm, more preferably 50 nm or more and not more than 250 nm, and especially preferably 80 nm or more and not more than 200 nm.

A layer containing such an organic compound is subjected to film formation by a dry film formation method or a wet film formation method. Specific examples of the dry film formation method include physical vapor phase epitaxy methods such as a vacuum vapor deposition method, a sputtering method, an ion plating method, and an MBE method and CVD methods such as plasma polymerization. Examples of the wet film formation method include a casting method, a spin coating method, a dipping method, and an LB method.

In the case of using a high molecular compound in at least one of the p-type semiconductor (compound) and the n-type semiconductor (compound), it is preferable that the film formation is achieved by a wet film formation method which is easy for the preparation. In the case of employing a dry film formation method such as vapor deposition, the use of a high molecular compound is difficult because of possible occurrence of decomposition. Accordingly, its oligomer can be preferably used instead of that. On the other hand, in the case of using a low molecular compound, a dry film formation method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to achieve uniform vapor deposition, it is preferable that the vapor deposition is carried out while rotating the substrate. A high degree of vacuum is preferable. The vacuum vapor deposition is carried out at a degree of vacuum of not more than $10^{-4}$ Torr, preferably not more than $10^{-6}$ Torr, and especially preferably not more than $10^{-8}$ Torr. It is preferable that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so no. It is preferably employed to subject the vapor deposition rate to PI or PID control using a layer thickness monitor such as a quartz oscillator and an interferometer. In the case of vapor depositing two or more kinds of compounds at the same time, a co-vapor deposition method, a flash vapor deposition method and so on can be preferably employed.

The electromagnetic wave absorption/photoelectric conversion site which is made of an organic layer which is the organic photoelectric conversion layer of the invention is interposed between one pair of electrodes, and a pixel electrode and a counter electrode are formed, respectively. It is preferable that the lower layer is a pixel electrode.

It is preferable that the counter electrode extracts a hole from a hole transport photoelectric conversion layer or a hole transport layer. As the counter electrode, a metal, an alloy, a metal oxide, an electrically conducting compound, or a mixture thereof can be used. It is preferable that the pixel electrode extracts an electron from an electron transport photoelectric conversion layer or an electron transport layer. The pixel electrode is selected while taking into consideration adhesion to an adjacent layer such as an electron transport photoelectric conversion layer and an electron transport layer, electron affinity, ionization potential, stability, and the like. Specific examples thereof include conducting metal oxides such as tin oxide, zinc oxide, indium oxide, and indium tin oxide (ITO); metals such as gold, silver, chromium, and nickel; mixtures or stacks of such a metal and such a conducting metal oxide; inorganic conducting substances such as copper iodide and copper sulfide; organic conducting materials such as polyaniline, polythiophene, and polypyrrole; silicon compounds; and stack materials thereof with ITO. Of these, conducting metal oxides are preferable; and ITO and IZO are especially preferable in view of productivity, high conductivity, transparency, and so on.

In the invention, the transparent conducting layer which is the counter electrode preferably has a thickness of 5 nm or more and not more than 50 nm. When the thickness of the transparent conducting layer is too thin, the voltage cannot be uniformly applied, whereas when it is too thick, the yield is lowered due to a short circuit as caused possibly by damage at the time of preparing a transparent conducting layer. In the invention, the thickness of the transparent conducting layer is more preferably 10 nm or more and not more than 40 nm.

In the preparation of the pixel electrode and the counter electrode, various methods are employable depending upon the material. For example, in the case of ITO, the layer is formed by a method such as an electron beam method, a sputtering method, a resistance heating vapor deposition method, a chemical reaction method (for example, a sol-gel method), and coating of a dispersion of indium tin oxide. In the case of ITO, a UV-ozone treatment, a plasma treatment, or the like can be applied.

In the invention, it is preferable that a transparent electrode layer is prepared in a plasma-free state. By preparing a transparent electrode layer in a plasma-free state, it is possible to minimize influences of the plasma against the substrate and to make photoelectric conversion characteristics satisfactory. Here, the term "plasma-free state" means a state that plasma is not generated during the film formation of a transparent electrode layer or that a distance from the plasma generation source to the substrate is 2 cm or more, preferably 10 cm or more, and more preferably 20 cm or more and that the plasma which reaches the substrate is reduced.

Examples of a device in which plasma is not generated during the film formation of a transparent electrode layer include an electron beam vapor deposition device (EB vapor deposition device) and a pulse laser vapor deposition device. With respect to the EB vapor deposition device or pulse laser vapor deposition device, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used. In the following, the method for achieving film formation of a transparent electrode film using an EB vapor deposition device is referred to as "EB vapor deposition method"; and the method for achieving film formation of a transparent electrode film using a pulse laser vapor deposition device is referred to as "pulse laser vapor deposition method".

With respect to the device capable of realizing the state that a distance from the plasma generation source to the substrate is 2 cm or more and that the plasma which reaches the substrate is reduced (hereinafter referred to as "plasma-free film formation device"), for example, a counter target type sputtering device and an arc plasma vapor deposition method can be thought. With respect to these matters, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used.

The electrode of the organic electromagnetic wave absorption/photoelectric conversion site according to the invention will be hereunder described in more detail. The photoelectric conversion layer as an organic layer is interposed between a pixel electrode layer and a counter electrode layer and can contain an interelectrode material or the like. The "pixel electrode layer" as referred to herein refers to an electrode layer as prepared above a substrate in which a charge storage/transfer/read-out site is formed and is usually divided for every one pixel. This is made for the purpose of obtaining an image by reading out a signal charge which has been converted by the photoelectric conversion layer on a charge storage/transfer/signal read-out circuit substrate for every one pixel.

The "counter electrode layer" as referred to herein has a function to discharge a signal charge having a reversed polarity to a signal charge by interposing the photoelectric conversion layer together with the pixel electrode layer. Since this discharge of a signal charge is not required to be divided among the respective pixels, the counter electrode layer can be usually made common among the respective pixels. For that reason, the counter electrode layer is sometimes called a common electrode layer.

The photoelectric conversion layer is positioned between the pixel electrode layer and the counter electrode layer. The photoelectric conversion function functions by this photoelectric convention layer and the pixel electrode layer and the counter electrode layer.

As examples of the configuration of the photoelectric conversion layer stack, first of all, in the case where one organic layer is stacked on a substrate, there is enumerated a construction in which a pixel electrode layer (basically a transparent electrode layer), a photoelectric conversion layer and a counter electrode layer (transparent electrode layer) are stacked in this order from the substrate. However, it should not be construed that the invention is limited thereto.

In addition, in the case where two organic layers are stacked on a substrate, there is enumerated a construction in which a pixel electrode layer (basically a transparent electrode layer), a photoelectric conversion layer, a counter electrode layer (transparent electrode layer), an interlaminar insulating layer, a pixel electrode layer (basically a transparent electrode layer), a photoelectric conversion layer, and a counter electrode layer (transparent electrode layer) are stacked in this order from the substrate.

As the material of the transparent electrode layer which configures the photoelectric conversion site, materials which can be subjected to film formation by a plasma-free film formation device, EB vapor deposition device or pulse laser vapor deposition device. For example, metals, alloys, metal oxides, metal nitrides, metallic borides, organic conducting compounds, and mixtures thereof can be suitably enumerated. Specific examples thereof include conducting metal oxides such as tin oxide, zinc oxide, indium oxide, indium zinc oxide (IZO), indium tin oxide (ITO), and indium tungsten oxide (IWO); metal nitrides such as titanium nitride; metals such as gold, platinum, silver, chromium, nickel, and aluminum; mixtures or stacks of such a metal and such a conducting metal oxide; inorganic conducting substances such as copper iodide and copper sulfide; organic conducting materials such as polyaniline, polythiophene, and polypyrrole; and stacks thereof with ITO. Also, materials as described in detail in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein may be used.

As the material of the transparent electrode layer, any one material of ITO, IZO, $SnO_2$, ATO (antimony-doped tin oxide) ZnO, AZO (Al-doped zinc oxide), GZO (gallium-doped zinc oxide), $TiO_2$, or FTO (fluorine-doped tin oxide) is especially preferable. A light transmittance of the transparent electrode layer is preferably 60% or more, more preferably 80% or more, further preferably 90% or more, and still further preferably 95% or more at a photoelectric conversion optical absorption peak wavelength of the photoelectric conversion layer to be contained in a photoelectric conversion device containing that transparent electrode layer. Furthermore, with respect to a surface resistance of the transparent electrode layer, its preferred range varies depending upon whether the transparent electrode layer is a pixel electrode or a counter electrode, whether the charge storage/transfer/read-out site is of a CCD structure or a CMOS structure, and the like. In the case where the transparent electrode layer is used for a counter electrode and the charge storage/transfer/read-out site is of a CMOS structure, the surface resistance is preferably not more than $10,000\Omega/\square$, and more preferably not more than $1,000\Omega/\square$. In the case where the transparent electrode layer is used for a counter electrode and the charge storage/transfer/read-out site is of a CCD structure, the surface resistance is preferably not more than $1,000\Omega/\square$, and more preferably not more than $100\Omega/\square$. In the case where the transparent electrode layer is used for a pixel electrode, the surface resistance is preferably not more than $1,000,000\Omega/\square$, and more preferably not more than $100,000\Omega/\square$.

Conditions at the time of film formation of a transparent electrode layer will be hereunder mentioned. A substrate temperature at the time of film formation of a transparent electrode layer is preferably not higher than 500° C., more preferably not higher than 300° C., further preferably not higher than 200° C., and still further preferably not higher than 150° C. Furthermore, a gas may be introduced during the film formation of a transparent electrode. Basically, though the gas species is not limited, Ar, He, oxygen, nitrogen, and so on can be used. Furthermore, a mixed gas of such gases may be used. In particular, in the case of an oxide material, since oxygen deficiency often occurs, it is preferred to use oxygen.

The case of applying voltage to the photoelectric conversion layer according to the invention is preferable in view of improving the photoelectric conversion efficiency. Though any voltage is employable as the voltage to be applied, necessary voltage varies with the layer thickness of the photoelectric conversion layer. That is, the larger an electric field to be added in the photoelectric conversion layer, the more improved the photoelectric conversion efficiency is. However, even when the same voltage is applied, the thinner the layer thickness of the photoelectric conversion layer, the larger an electric field to be applied is. Accordingly, in the case where the layer thickness of the photoelectric conversion film is thin, the voltage to be applied may be relatively small. The electric field to be applied to the photoelectric conversion layer is preferably 10 V/cm or more, more preferably $1\times10^3$ V/cm or more, further preferably $1\times10^5$ V/cm or more, especially preferably $1\times10^6$ V/cm or more, and most preferably $1\times10^7$ V/cm or more. Though there is no particular upper limit, when the electric field is excessively applied, an electric current flows even in a dark place and therefore, such is not preferable. The electric field is preferably not more than $1\times10^{12}$ V/cm, and more preferably not more than $1\times10^9$ V/cm.

An inorganic layer as the electromagnetic wave absorption/photoelectric conversion site which is the inorganic photoelectric conversion layer of the invention will be hereunder described. In this case, light which has passed through the organic layer as the upper layer is subjected to photoelectric conversion in the inorganic layer. With respect to the inorganic layer, pn junction or pin junction of crystalline silicon, amorphous silicon, or a chemical semiconductor such as GaAs is generally employed. With respect to the stack type structure, a method as disclosed in U.S. Pat. No. 5,965,875 can be employed. That is, a construction in which a light receiving part as stacked by utilizing wavelength dependency of a coefficient of absorption of silicon is formed and color separation is carried out in a depth direction thereof. In this case, since the color separation is carried out with a light penetration depth of silicon, a spectrum range as detected in each of the stacked light receiving parts becomes broad. However, by using the foregoing organic layer as the upper layer, namely by detecting the light which has transmitted through the organic layer in the depth direction of silicon, the color separation is remarkably improved. In particular, when a G layer is disposed in the organic layer, since light which has transmitted through the organic layer is B light and R light, only BR light is subjective to separation of light in the depth direction in silicon so that the color separation is improved. Even in the case where the organic layer is a B layer or an R layer, by properly selecting the electromagnetic wave absorption/photoelectric conversion site of silicon in the depth direction, the color separation is remarkably improved. In the case where the organic layer is made of two layers, the function as the electromagnetic wave absorption/photoelectric conversion site of silicon may be brought for only one color, and preferred color separation can be achieved.

The inorganic layer preferably has a structure in which plural photodiodes are superposed for every pixel in a depth direction within the semiconductor substrate and a color signal corresponding to a signal charge as generated in each of the photodiodes by light as absorbed in the plural photodiodes is read out into the external. It is preferable that the plural photodiodes contain a first photodiode as provided in the depth for absorbing B light and at least one second photodiode as provided in the depth for absorbing R light and are provided with a color signal read-out circuit for reading out a color signal corresponding to the foregoing signal charge as generated in each of the foregoing plural photodiodes. According to this construction, it is possible to carry out color separation without using a color filter. Furthermore, according to circumstances, since light of a negative sensitive component can also be detected, it becomes possible to realize color imaging with good color reproducibility. Moreover, in the invention, it is preferable that a junction part of the foregoing first photodiode is formed in a depth of up to about 0.2 µm from the semiconductor substrate surface and that a junction part of the foregoing second photodiode is formed in a depth of up to about 2 µm from the semiconductor substrate surface.

The inorganic layer will be hereunder described in more detail. Preferred examples of the construction of the inorganic layer include a photoconductive type, a p-n junction type, a shotkey junction type, a PIN junction type, a light receiving device of MSM (metal-semiconductor-metal) type, and a light receiving device of phototransistor type. In the invention, it is preferred to use a light receiving device in which a plural number of a first conducting type region and a second conducting type region which is a reversed conducting type to the first conducting type are alternately stacked within a single semiconductor substrate and each of the junction planes of the first conducting type and second conducting type regions is formed in a depth suitable for subjecting mainly plural lights of a different wavelength region to photoelectric conversion The single semiconductor substrate is preferably mono-crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor as adjusted so as to have a maximum Absorption value within a blue wavelength range by properly changing the In-containing composition. That is, the composition becomes $In_xGa_{1-x}N$ ($0 \leq x < 1$). Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving part similar to the InGaN based semiconductor. Furthermore, InAlP or InGaAlP lattice-matching with a GaAs substrate can also be used.

The inorganic semiconductor may be of a buried structure. The "buried structure" as referred to herein refers to a construction in which the both ends of a short wavelength light receiving part are covered by a semiconductor different from the short wavelength light receiving part. The semiconductor for covering the both ends is preferably a semiconductor having a band gap wavelength shorter than or equal to a hand gap wavelength of the short wavelength light receiving part.

The organic layer and the inorganic layer may be bound to each other in any form.

Furthermore, for the purpose of electrically insulating the organic layer and the inorganic layer from each other, it is preferred to provide an insulating layer therebetween.

With respect to the junction, npn junction or pnpn junction from the light incident side is preferable. In particular, the pnpn junction is more preferable because by providing a p layer on the surface and increasing a potential of the surface, it is possible to trap a hole as generated in the vicinity of the surface and a dark current and reduce the dark current.

In such a photodiode, when an n-type layer, a p-type layer, an n-type layer and a p-type layer which are successively diffused from the p-type silicon substrate surface are deeply formed in this order, the pn-junction diode is formed of four layers of pnpn in a depth direction of silicon. With respect to the light which has come into the diode from the surface side, the longer the wavelength, the deeper the light penetration is. Also, the incident wavelength and the attenuation coefficient are inherent to silicon. Accordingly, the photodiode is designed such that the depth of the pn junction plane covers respective wavelength bands of visible light. Similarly, a junction diode of three layers of npn is obtained by forming an n-type layer, a p-type layer and n-type layer in this order. Here, a light signal is extracted from the n-type layer, and the p-type layer is connected to a ground wire.

Furthermore, when an extraction electrode is provided in each region and a prescribed reset potential is applied, each region is depleted, and the capacity of each junction part becomes small unlimitedly. In this way, it is possible to make the capacity as generated on the junction plane extremely small.

In the invention, it is preferred to provide an ultraviolet light absorption layer and/or an infrared light absorption layer as an uppermost layer of the electromagnetic wave absorption/photoelectric conversion site. The ultraviolet light absorption layer is able to at least absorb or reflect light of not more than 400 nm and preferably has an absorptance of 50% or more in a wavelength region of not more than 400 nm. The infrared light absorption layer is able to at least absorb or reflect light of 700 nm or more and preferably has an absorptance of 50% or more in a wavelength region of 700 nm or more.

Such an ultraviolet light absorption layer or infrared light absorption layer can be formed by a conventionally known method. For example, there is known a method in which a mordant layer made of a hydrophilic high molecular substance such as gelatin, casein, glue, and polyvinyl alcohol is provided on a substrate and a dye having a desired absorption wavelength is added to or dyes the mordant layer to form a colored layer. In addition, there is known a method of using a colored resin resulting from dispersing a certain kind of coloring material in a transparent resin. For example, it is possible to use a colored resin layer resulting from mixing a coloring material in a polyamino based resin as described in JP-A-58-46325, JP-A-60-78401, JP-A-60-184202, JP-A-60-184203, JP-A-60-184204, and JP-A-60-184205. A coloring agent using a polyamide resin having photosensitivity can also be used.

It is also possible to disperse a coloring material in an aromatic polyamide resin containing a photosensitive group in the molecule thereof and capable of obtaining a cured layer at not higher than 200° C. as described in JP-B-7-113685 and to use a colored resin having a pigment dispersed therein as described in JP-B-7-69486.

In the invention, a dielectric multiple layer is preferably used. The dielectric multiple layer has sharp wavelength dependency of light transmission and is preferably used.

It is preferable that the respective electromagnetic wave absorption/photoelectric conversion sites are separated by an insulating layer. The insulating layer can be formed by using a transparent insulating material such as glass, polyethylene, polyethylene terephthalate, polyethersulfone, and polypropylene. Silicon nitride, silicon oxide, and the like are also preferably used. Silicon nitride prepared by film formation by plasma CVD is preferably used in the invention because it is high in compactness and good in transparency.

For the purposes of preventing damages in the process and preventing contact with oxygen, moisture, etc., a protective layer or a sealing layer can be provided, too. Examples of the protective layer include a diamond thin layer, an inorganic material layer made of a metal oxide, a metal nitride, etc., a high molecular layer made of a fluorine resin, poly-p-xylene, polyethylene, a silicone resin, a polystyrene resin, etc., and a layer made of a photocurable resin. Silicon nitride, silicon oxide, and the like are also preferably used. Silicon nitride prepared by film formation by plasma CVD is preferably used in the invention because it is high in compactness and good in transparency.

The protective layer is preferably of a structure of two or more layers, and in particular, the total thickness of the protective layer is preferably 1 μm or more and not more than 10 μm. By setting up the thickness of the protective layer at this range, it becomes possible to make both the optical characteristics of the photoelectric conversion device and the storage stability with time which is often considered problematic in organic materials compatible with each other. The total thickness of the protective layer is especially preferably 2 μm or more and not more than 9 μm. In the invention, as described previously, since it is effective that the transparent electrode is thin, this protective layer is important for protecting the organic photoelectric conversion layer.

In addition to the plasma assist method, examples of the CVD method include various methods such as an IPC-CVD method and a Cat-CVD method. The CVD method can be properly selected and employed. By using silicon nitride and silicon oxide through a multilayered configuration, it is possible to form the protective layer in which both barrier properties and flexibility of the protective layer are compatible with each other. Silicon nitride is preferably used because its component ratio is close to the stoichiometric composition and its protective film performance is satisfactory.

Furthermore, it is also possible to cover a device portion by glass, a gas-impermeable plastic, a metal, etc. and package the device itself by a suitable sealing resin. In this case, it is also possible to make a substance having high water absorption properties present in a packaging.

In addition, light collecting efficiency can be improved by forming a microlens array in the upper part of a light receiving device, and therefore, such an embodiment is preferable, too.

As to the charge storage/transfer/read-out site, JP-A-58-103166, JP-A-58-103165, JP-A-2003-332551, and so on can be made hereof by reference. A construction in which an MOS transistor is formed on a semiconductor substrate for every pixel unit or a construction having CCD as a device can be properly employed. For example, in the case of a photoelectric conversion device using an MOS transistor, a charge is generated in a photoelectric conversion layer by incident light which has transmitted through electrodes; the charge runs to the electrodes within the photoelectric conversion layer by an electric field as generated between the electrodes by applying voltage to the electrodes; and the charge is further transferred to a charge storage part of the MOS transistor and stored in the charge storage part. The charge as stored in the charge storage part is transferred to a charge read-out part by switching of the MOS transistor and further outputted as an electric signal. In this way, full-color image signals are inputted in a solid imaging device including a signal processing part.

The signal charge can be read out by injecting a fixed amount of bias charge into the storage diode (refresh mode) and then storing a fixed amount of the charge (photoelectric conversion mode). The light receiving device itself can be used as the storage diode, or an storage diode can be separately provided.

The read-out of the signal will be hereunder described in more detail. The read-out of the signal can be carried out by using a usual color read-out circuit. A signal charge or a signal current which is subjected to light/electric conversion in the light receiving part is stored in the light receiving part itself or a capacitor as provided. The stored charge is subjected to selection of a pixel position and read-out by a measure of an MOS type imaging device (so-called CMOS sensor) using an X-Y address system. Besides, as an address selection system, there is enumerated a system in which every pixel is successively selected by a multiplexer switch and a digital shift register and read out as a signal voltage (or charge) on a common output line. An imaging device of a two-dimensionally arrayed X-Y address operation is known as a CMOS sensor. In this imaging device, a switch as provided in a pixel connected to an X-Y intersection point is connected to a vertical shift register, and when the switch is turned on by a voltage from the vertical scanning shift register, signals as read out from pixels as provided in the same line is read out on the output line in a column direction. The signals are successively read out from an output end through the switch to be driven by a horizontal scanning shift register.

For reading out the output signals, a floating diffusion detector or a floating gate detector can be used. Furthermore, it is possible to seek improvements of S/N by a measure such as provision of a signal amplification circuit in the pixel portion and correlated double sampling.

For the signal processing, gamma correction by an ADC circuit, digitalization by an AD transducer, luminance signal processing, and color signal processing can be applied. Examples of the color signal processing include white balance processing, color separation processing, and color matrix processing. In using for an NTSC signal, an RGB signal can be subjected to conversion processing of a YIQ signal.

The charge transfer/read-out site must have a mobility of charge of 100 cm$^2$/vol·sec or more. This mobility can be obtained by selecting the material among semiconductors of the IV group, the III-V group or the II-VI group. Above all, silicon semiconductors (also referred to as "Si semiconductor") are preferable because of advancement of microstructure refinement technology and low costs. As to the charge transfer/charge read-out system, there are made a number of proposals, and all of them are employable. Above all, a COMS type device or a CCD type device is an especially preferred system. In addition, in the case of the invention, in many occasions, the CMOS type device is preferable in view of high-speed read-out, pixel addition, partial read-out and consumed electricity.

Though plural contact sites for connecting the electromagnetic wave absorption/photoelectric conversion side to the charge transfer/read-out site may be connected by any metal, a metal selected among copper, aluminum, silver, gold, chromium and tungsten is preferable, and copper is especially preferable. In response to the plural electromagnetic wave absorption/photoelectric conversion sites, each of the contact sites must be placed between the electromagnetic wave absorption/photoelectric conversion site and the charge transfer/read-out site. In the case of employing a stacked structure of plural photosensitive units of blue, green and red lights, a blue light extraction electrode and the charge transfer/read-out site, a green light extraction electrode and the charge transfer/read-out site, and a red light extraction electrode and the charge transfer/read-out site must be connected, respectively.

The stacked photoelectric conversion device according to the invention can be produced according to a so-called known microfabrication process which is employed in manufacturing integrated circuits and the like. Basically, this process is concerned with a repeated operation of pattern exposure with active light, electron beams, etc. (for example, i- or g-bright line of mercury, excimer laser, X-rays, and electron beams), pattern formation by development and/or burning, alignment of device forming materials (for example, coating, vapor deposition, sputtering, and CV), and removal of the materials in a non-pattern area (for example, heat treatment and dissolution treatment).

A chip size of the device can be selected among a brownie size, a 135 size, an APS size, a 1/1.8-inch size, and a smaller size. A pixel size of the stacked photoelectric conversion device according to the invention is expressed by a circle-corresponding diameter which is corresponding to a maximum area in the plural electromagnetic absorption/photoelectric conversion sites. Though the pixel size is not limited, it is preferably from 2 to 20 microns, more preferably from 2 to 10 microns, and especially preferably from 3 to 8 microns.

When the pixel size exceeds 20 microns, a resolving power is lowered, whereas when the pixel size is smaller than 2 microns, the resolving power is also lowered due to radio interference between the sizes.

The stacked photoelectric conversion device according to the invention can be utilized for a digital still camera. Also, it is preferable that the photoelectric conversion device according to the invention is used for a TV camera. Besides, the photoelectric conversion device according to the invention can be utilized for a digital video camera, a monitor camera (m, for example, office buildings, parking lots, unmanned loan-application systems in financial institution, shopping centers, convenience stores, outlet malls, department stores, pachinko parlors, karaoke boxes, game centers, and hospitals), other various sensors (for example, TV door intercoms, individual authentication sensors, sensors for factory automation, robots for household use, industrial robots, and piping examination systems), medical sensors (for example, endoscopes and fundus cameras), videoconference systems, television telephones, camera-equipped mobile phones, automobile safety running systems (for example, back guide monitors, collision prediction systems, and lane-keeping systems), and sensors for video game.

Above all, the photoelectric conversion device according to the invention is suitable for use of a television camera. The reason for this resides in the matter that since it does not require a color decomposition optical system, it is able to achieve miniaturization and weight reduction of the television camera. Furthermore, since the photoelectric conversion device according to the invention has high sensitivity and high resolving power, it is especially preferable for a television camera for high-definition broadcast. In this case, the term "television camera for high-definition broadcast" as referred to herein includes a camera for digital high-definition broadcast.

In addition, the photoelectric conversion device according to the invention is preferable because an optical low pass filter can be omitted and higher sensitivity and higher resolving power can be expected.

In addition, in the photoelectric conversion device according to the invention, not only the thickness can be made thin, but also a color decomposition optical system is not required. Therefore, with respect to shooting scenes in which a different sensitivity is required, such as "circumstances with a different brightness such as daytime and nighttime" and "immobile subject and mobile subject" and other shooting scenes in which requirements for spectral sensitivity or color reproducibility differ, various needs for shooting can be satisfied by a single camera by exchanging the photoelectric conversion device according to the invention and performing shooting. At the same time, it is not required to carry plural cameras. Thus, a load of a person who wishes to take a shot is reduced. As a photoelectric conversion device which is subjective to the exchange, in addition to the foregoing, exchangeable photoelectric conversion devices for purposes of infrared light shooting, black-and-white shooting, and change of a dynamic range can be prepared.

Figure 2:
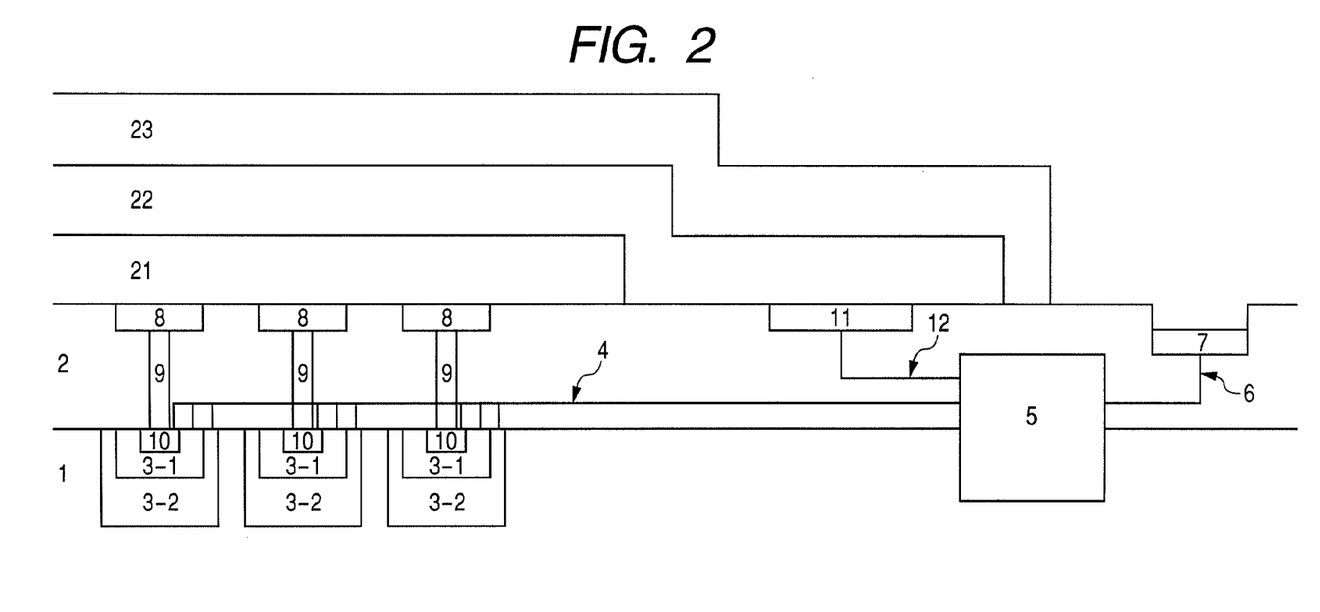
FIG. 2 is a cross-sectional view to explain an embodiment in which an organic photoelectric conversion layer or the like is prepared above an inorganic photoelectric conversion layer by a shadow mask method.

The TV camera using the photoelectric conversion device of the invention can be prepared by referring to a description in Chapter 2 of *Design Technologies of Television Camera*, edited by the Institute of Image Information and Television Engineers (Aug. 20, 1999, published by Corona Publishing Co., Ltd.) and, for example, replacing a color decomposition optical system and an imaging device as a basic construction of a television camera as shown in FIG. 2.1 thereof by the photoelectric conversion device according to the invention.

By aligning the foregoing stacked light receiving device, it can be utilized not only as an imaging device but also as an optical sensor such as biosensors and chemical sensors or a color light receiving device in a single body.

EXAMPLES

The invention will be hereunder described with reference to the following Example, but it should not be construed that the invention is limited thereto.

An inorganic photoelectric conversion layer as illustrated is prepared. On that occasion, a connection electrode 11 is formed together with respective pixel electrodes 8 and a peripheral pad 7 on the surface of an insulating layer 2 as provided on a silicon substrate 1, thereby forming a substrate for forming an organic photoelectric conversion layer. The pixel electrode 8 is formed of ITO, its size is 10 µm×10 µm, and a pitch between the pixels is 2 μm. The pixel number is 161×120=19,320 pixels. The connection electrode 11 is formed of ITO, and its size is 2 mm×50 μm. A distance between the connection electrode 11 and the pixel electrode 9 located in the closest position thereto is 1 mm, and a distance between the connection electrode 11 and the peripheral pad 7 is 1 mm. The subject substrate is ultrasonically cleaned with acetone, SEMICOCLEAN and isopropyl alcohol (IPA), respectively for 15 minutes. Finally, the substrate is cleaned with boiling IPA and then with UV/O$_3$.

This substrate is subjected to resistance heating vapor deposition successively with 30 nm of a hole blocking material BCP (the following Compound 1; 2,9-dimethyl-4,7-diphenyl-1,10-phenanthroline), 20 nm of an n-type organic material Alq3 (the following Compound 2; tris (8-hydroxyquinolinato) aluminum (III) complex), 200 nm of a co-vapor deposited layer of an n-type organic material Alq3 (Compound 2) and a p-type organic material quinacridone (the following Compound 3), 30 nm of a p-type organic material quinacridone (Compound 3), and 40 nm of an electron blocking material m-MTDATA (the following Compound 4; 4,4',4''-tris-(N-(3-methylphenyl)-N-phenylamino)triphenylamine) through a shadow mask so as to cover the respective pixel electrodes 8, thereby achieving film formation (the formation of an organic photoelectric conversion layer 21). Thereafter, ITO is subjected to sputtering film formation in a thickness of 20 nm through a separate shadow mask so as to cover the organic photoelectric conversion layer 21 and the connection electrode 11 (the formation of a counter electrode 22). In addition, silicon nitride is subjected to film formation in a thickness of 5 μm through a separate shadow mask by a plasma CVD method while leaving the peripheral pad 7 so as to cover the ITO transparent counter electrode 22 (the formation of a protective layer 23), thereby preparing a photoelectric conversion device as illustrated in FIG. 2.

Wire bonding with the peripheral pad 7 is carried out, thereby completing packaging. There can be thus obtained an imaging device.

Compound 1: BCP

Compound 2: Alq3

Compound 3: Quinacridone

Compound 4: m-MTDATA

Since in the photoelectric conversion device of the invention, the organic photoelectric conversion layer 21 or the like is produced by a shadow mask method, it is possible to stably produce a photoelectric conversion device or imaging device of an inorganic/organic stack type having fine pixels, which is substantially free from damages to the organic layer.

This application is based on Japanese Patent application JP 2005-240965, filed Aug. 23, 2005, the entire content of which is hereby incorporated by reference, the same as if set forth at length.

What is claimed is:

1. A process for producing a photoelectric conversion device including a semiconductor substrate, an inorganic photoelectric conversion layer provided within the semiconductor substrate, an organic photoelectric conversion layer provided above the inorganic photoelectric conversion layer, a connection electrode provided above the semiconductor substrate, at least one counter electrode which is in contact with the organic photoelectric conversion layer and is directly connected to the connection electrode, and plural pixel electrodes which are in contact with the organic photoelectric conversion layer, wherein a distance between the connection electrode and the pixel electrode located in the closest position to the connection electrode is from 10 μm to 3 mm and the connection electrode is provided between the semiconductor substrate and the at least one counter electrode, the process comprising: producing the organic photoelectric conversion layer by a shadow mask method; and producing the at least one counter electrode by a shadow mask method so that the at least one counter electrode is in contact with the organic photoelectric conversion layer and is connected to the connection electrode.

* * * * *